US007064045B2

(12) United States Patent
Yang

(10) Patent No.: US 7,064,045 B2
(45) Date of Patent: Jun. 20, 2006

(54) LASER BASED METHOD AND DEVICE FOR FORMING SPACER STRUCTURES FOR PACKAGING OPTICAL REFLECTION DEVICES

(75) Inventor: Xiao "Charles" Yang, Cupertino, CA (US)

(73) Assignee: Miradia Inc., Sunnyvale, CA (US)

( * ) Notice: Subject to any disclaimer, the term of this patent is extended or adjusted under 35 U.S.C. 154(b) by 0 days.

(21) Appl. No.: 10/930,312

(22) Filed: Aug. 30, 2004

(65) Prior Publication Data

US 2006/0046429 A1    Mar. 2, 2006

(51) Int. Cl.
*H01L 21/76* (2006.01)
*H01L 21/30* (2006.01)
*H01L 21/46* (2006.01)

(52) U.S. Cl. .................. 438/443; 438/458; 438/459
(58) Field of Classification Search ................ 438/443, 438/459, 977, 978, 458, 463; 257/729
See application file for complete search history.

(56) References Cited

U.S. PATENT DOCUMENTS

| | | | | |
|---|---|---|---|---|
| 3,997,964 | A * | 12/1976 | Holbrook et al. | 438/463 |
| 5,457,022 | A * | 10/1995 | Hioki et al. | 430/612 |
| 6,093,623 | A * | 7/2000 | Forbes | 438/455 |
| 6,294,439 | B1 * | 9/2001 | Sasaki et al. | 438/464 |
| 6,417,075 | B1 * | 7/2002 | Haberger et al. | 438/459 |
| 6,562,658 | B1 * | 5/2003 | Ohuchi et al. | 438/113 |
| 6,653,210 | B1 * | 11/2003 | Choo et al. | 438/460 |
| 6,664,503 | B1 * | 12/2003 | Hsieh et al. | 438/460 |
| 6,822,326 | B1 | 11/2004 | Enquist et al. | |
| 2005/0233546 | A1 * | 10/2005 | Oohata et al. | 438/458 |

* cited by examiner

Primary Examiner—Walter L Lindsay, Jr.
(74) Attorney, Agent, or Firm—Townsend and Townsend and Crew LLP

(57) ABSTRACT

A method for forming a patterned silicon bearing material, e.g., silicon substrate. The method includes providing a silicon substrate, which has a surface region and a backside region. The method includes forming a plurality of recessed regions on the surface region. Each of the plurality of recessed regions has a border region. Preferably, the plurality of recessed regions forms a patterned surface region. The method includes bonding (e.g., hermetic bonding or on-hermetic seal) the patterned surface region to a handle surface region of a handle substrate, e.g., glass substrate. Each of the border regions, which protrude outwardly from the recessed regions, is bonded to the handle surface region, while each of the recessed regions remain free from attachment to any surface of the handle surface region. The method includes applying electromagnetic radiation comprising a laser beam to selected regions on the backside to ablate a thickness of silicon substrate overlying each of the recessed regions. The method also includes releasing a thickness of material defined within the recessed region while maintaining each of the border regions bonded to the handle surface region to form a plurality of silicon structures bonded to the handle surface region.

28 Claims, 17 Drawing Sheets

“Digital Light Processing”
LASER BASED METHOD AND DEVICE FOR FORMING SPACER STRUCTURES FOR PACKAGING OPTICAL REFLECTION DEVICES

BACKGROUND OF THE INVENTION

The present invention relates generally to packaging techniques. More particularly, the invention includes a method and structure for packaging optical devices using laser based cutting techniques for bonded substrates. Merely by way of example, the invention has been applied to integrating a mechanical based structure with an integrated circuit chip. But it would be recognized that the invention has a much broader range of applicability.

Visual display technologies have rapidly developed over the years. Most particularly, electronic displays for outputting television shows, streaming video, and the like. From the early days, cathode ray tube technology, commonly called CRTs, outputted selected pixel elements onto a glass screen in conventional television sets. These television sets originally output black and white moving pictures. Color television sets soon replaced most if not all black and white television units. Although very successful, CRTs were often bulky, difficult to make larger, and had other limitations.

CRTs were soon replaced, at least in part, with liquid crystal panel displays. These liquid crystal panel displays commonly called LCDs used an array of transistor elements coupled to a liquid crystal material and color filter to output moving pictures in color. Many computer terminals and smaller display devices often relied upon LCDs to output video, text, and other visual features. Unfortunately, liquid crystal panels often had low yields and were difficult to scale up to larger sizes. These LCDs were often unsuitable for larger displays often required for television sets and the like.

Accordingly, projection display units have been developed. These projection display units include, among others, a counterpart liquid crystal display, which outputs light from selected pixel elements through a lens to a larger display to create moving pictures, text, and other visual images. Another technology is called "Digital Light Processing" (DLP), which is a commercial name from Texas Instruments Incorporated (TI) of Texas, USA. DLP is often referred to as the use of "micro-mirrors." DLP relies upon a few hundred thousand tiny mirrors, which line up in 800 rows of 600 mirrors each. Each of the mirrors is hinged. An actuator is attached to each of the hinges. The actuator is often electrostatic energy that can tilt each of the mirrors at high frequency. The moving mirrors can modulate light, which can be transmitted through a lens and then displayed on a screen. Although DLP has been successful, it is often difficult to manufacture and subject to low yields, etc. DLP is also manufactured using MEMS based processing techniques. Such MEMS based processing technique is often costly and difficult to scale up for efficient processing. More specifically, packaging techniques used for MEMS are also difficult and costly to scale up.

From the above, it is seen that an improved technique for packaging devices is desired.

BRIEF SUMMARY OF THE INVENTION

According to the present invention, techniques for packaging optical devices are provided. More particularly, the invention includes method and structure for packaging optical devices using laser based cutting techniques for bonded substrates. Merely by way of example, the invention has been applied to integrating a mechanical based structure with an integrated circuit chip. But it would be recognized that the invention has a much broader range of applicability.

In a specific embodiment, the present invention provides a method for forming a patterned silicon bearing material, e.g., silicon substrate. The method includes providing a silicon substrate, which has a surface region and a backside region. The method includes forming a plurality of recessed regions on the surface region. Each of the plurality of recessed regions has a border region. Preferably, the plurality of recessed regions forms a patterned surface region. The method includes bonding (e.g., hermetic bonding or on-hermetic seal) the patterned surface region to a handle surface region of a handle substrate, e.g., glass substrate. Each of the border regions, which protrude outwardly from the recessed regions, is bonded to the handle surface region, while each of the recessed regions remain free from attachment to any surface of the handle surface region. The method includes applying electromagnetic radiation comprising a laser beam to selected regions on the backside to ablate a thickness of silicon substrate overlying each of the recessed regions. The method also includes releasing a thickness of material defined within the recessed region while maintaining each of the border regions bonded to the handle surface region to form a plurality of silicon structures bonded to the handle surface region.

Many benefits are achieved by way of the present invention over conventional techniques. For example, the present technique provides an easy to use process that relies upon conventional technology. In some embodiments, the method provides higher device yields for the bonded substrates. Additionally, the method provides a process that is compatible with conventional process technology without substantial modifications to conventional equipment and processes. Preferably, the invention provides for an improved integrated structure including integrated circuits and mirror structures for display applications. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

Figure 1:
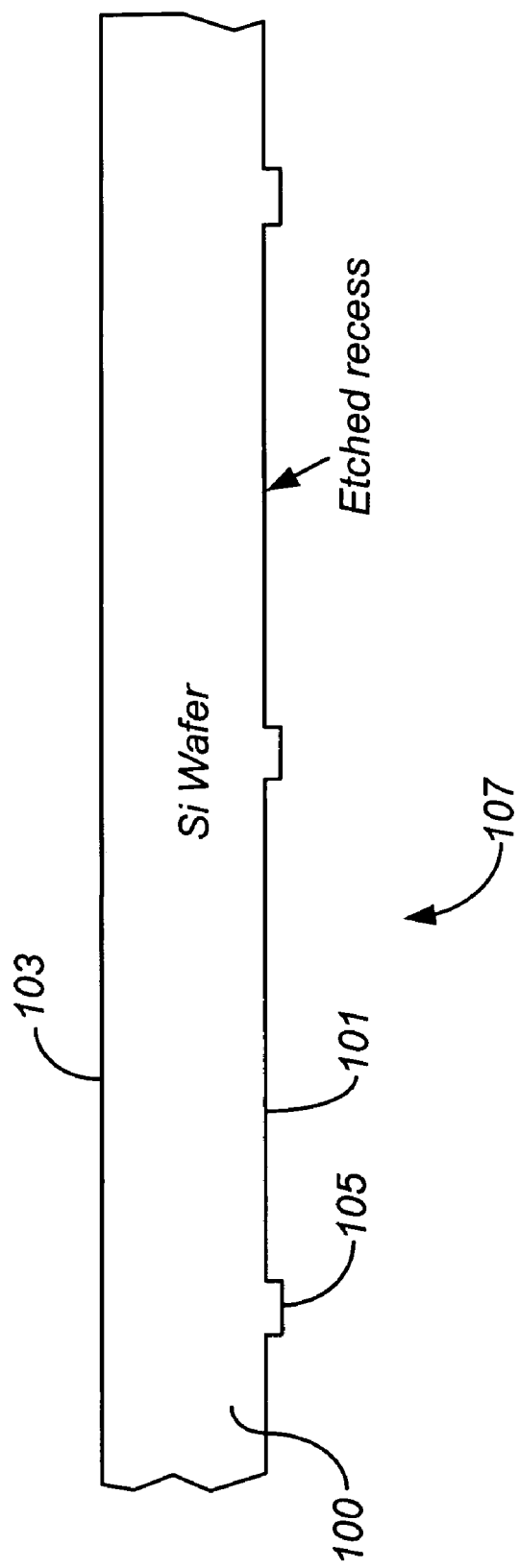
FIGS. 1 through 8 are simplified cross-sectional view diagrams illustrating methods for packaging an optical device according to embodiments of the present invention.

According to the present invention, techniques for packaging optical devices are provided. More particularly, the invention includes a method and structure for packaging optical devices using laser based cutting techniques for bonded substrates. Merely by way of example, the invention has been applied to integrating a mechanical based structure with an integrated circuit chip. But it would be recognized that the invention has a much broader range of applicability.

A method for packaging optical devices according to an embodiment of the present invention may be outlined as follows:

1. Provide a silicon substrate, which has a surface region and a backside region;
2. Mask substrate to form openings;
3. Form a plurality of recessed regions on the surface region, where each of the plurality of recessed regions has a border region surrounding a periphery of each of the recessed regions while using the patterned mask as a protective layer;
4. Strip mask layer;
5. Plasma activate surfaces of border regions (optional);
6. Bond (e.g., hermetic bonding or on-hermetic seal) the patterned surface region to a handle surface region of a handle substrate, e.g., glass substrate, where each of the border regions, which protrude outwardly from the recessed regions, is bonded to the handle surface region, while each of the recessed regions remain free from attachment to any surface of the handle surface region;
7. Perform bond treatment on bonded multi-layered substrates;
8. Apply electromagnetic radiation comprising a laser beam to selected regions on the backside to ablate a thickness of silicon substrate overlying each of the recessed regions (optionally, add protective layer to regions outside of the selected regions to protect such surfaces from effects of the electromagnetic radiation, which may cause damage);
9. Release via radiation a thickness of material defined within the recessed region while maintaining each of the border regions bonded to the handle surface region to form a plurality of silicon structures bonded to the handle surface region, where each of the silicon structures form a cavity region bordered by a portion of the handle substrate;
10. Plasma activate silicon structures (optional);
11. Bond each of the silicon structures to a device substrate (e.g., optical device, optical and integrated circuit device) to enclose a portion of the device substrate with each of the silicon structures;
12. Perform bond treatment to bonded substrates; and
13. Perform other steps, as desired.

The above sequence of steps provides a method for packaging a optical device according to an embodiment of the present invention. As shown, the method uses a combination of steps including a way of forming a plurality of silicon structures that form standoff regions to be bonded to a device substrate according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

FIGS. 1 through 8 are simplified cross-sectional view diagrams illustrating methods for packaging an optical device according to embodiments of the present invention. These diagrams are merely examples, which should not unduly limit the scope of the claims herein. One of ordinary skill in the art would recognize many variations, alternatives, and modifications. As shown, the diagrams provide methods for forming a patterned silicon bearing material for packaging optical devices according to an embodiment of the present invention. The method includes providing a silicon substrate 100, e.g., silicon wafer. The silicon substrate has a surface region 107 and a backside region 103. The surface region is often called a face region, although other terms may be used. The method includes forming a plurality of recessed regions 101 on the surface region. Each of the plurality of recessed regions having a border region 105. The plurality of recessed regions forms a patterned surface region. Depending upon the application, masking and etching techniques can be used to form each of the recessed regions. Preferably, each of the recessed regions has a depth of more than about 10 microns although other depths can be used. Plasma and/or reactive ion etching techniques may be used, depending upon the embodiment. Each of the recessed regions corresponds to a region to be occupied by at least one "chip" or "device" depending upon the embodiment.

Figure 2:
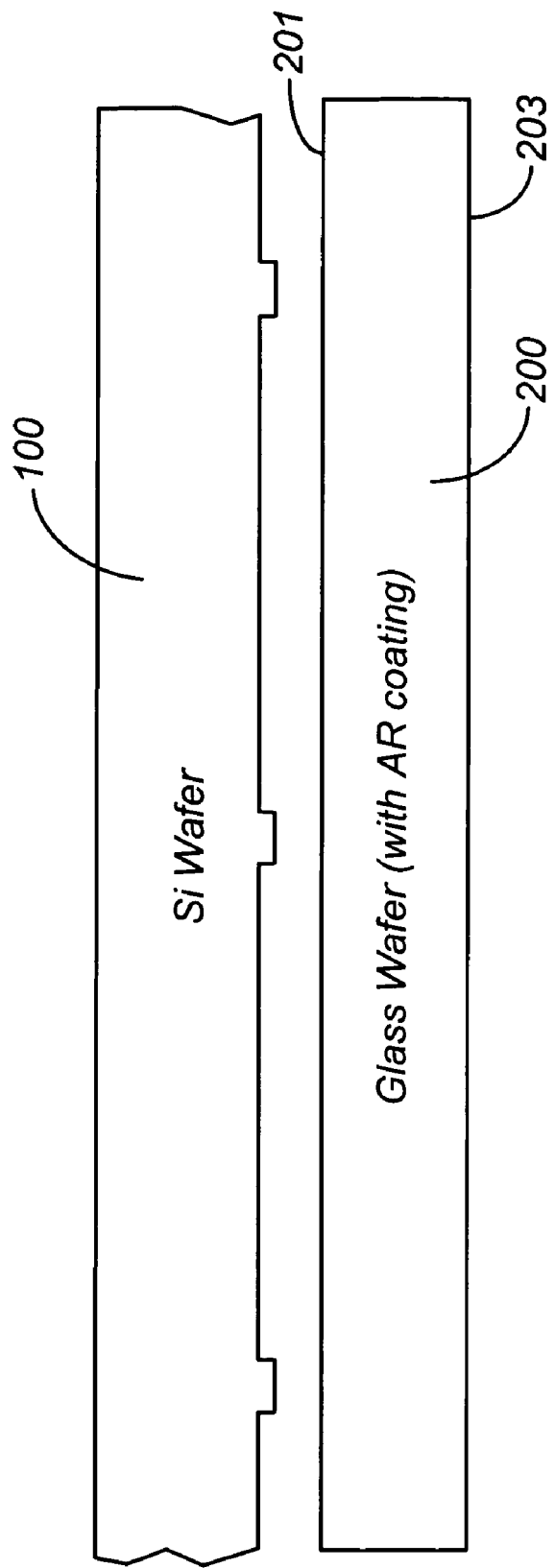

Referring to FIG. 2, the method includes bonding the patterned surface region to a handle surface region of a handle substrate 200. The handle substrate includes surface region 201 and backside region 203. Optionally, each of the substrates can be treated to enhance bonding. Treatment can include plasma activation using an oxygen bearing plasma or other plasma and the like. An antireflective coating may be applied to the backside and surface of the handle substrate. Preferably, the handle substrate is optically transparent, such as a Eagle 2000™ product manufactured by Corning Incorporated of One Riverfront Plaza, Corning, N.Y. 14831, although there may be others. Other products manufactured by Hoya Optics of Japan or Schott Glass of Germany. The antireflective coating can include magnesium difluoride, thin film stacking, or other suitable materials. Of course, one of ordinary skill in the art would recognize many variations, modifications, and alternatives.

Figure 3:
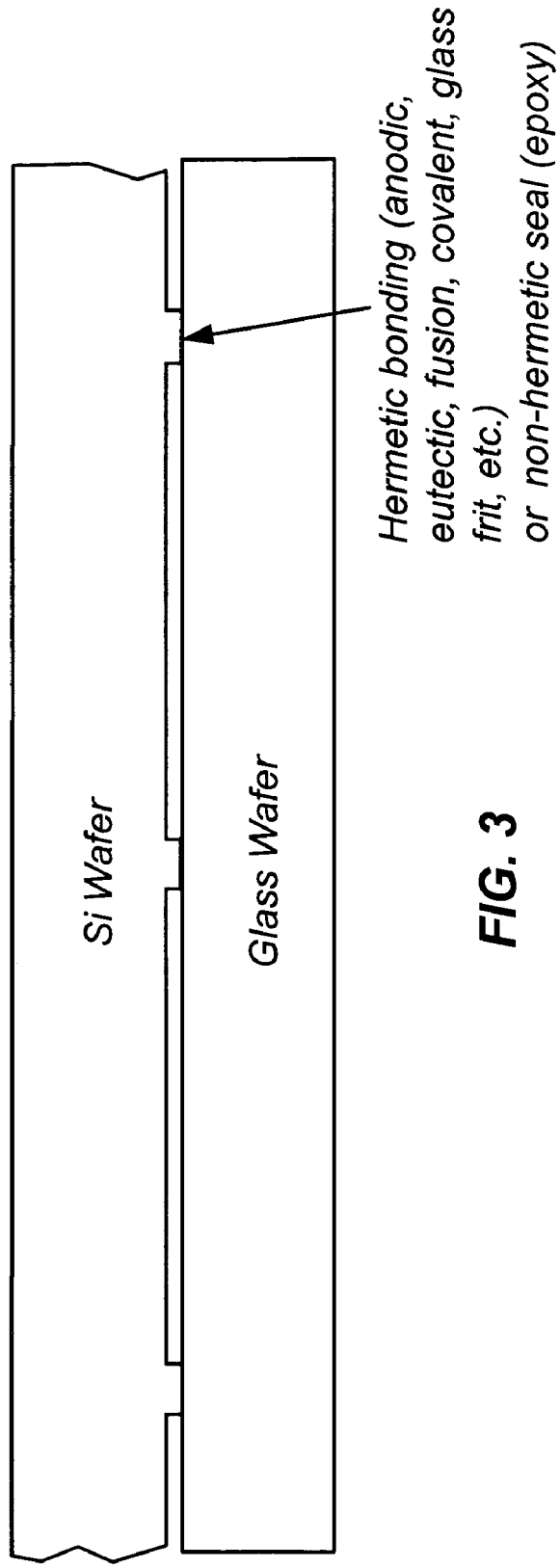

Each of the border regions is bonded to the handle surface region, while each of the recessed regions remain free from attachment to any surface of the handle surface region, as shown in FIG. 3. In a specific embodiment, the bonding is provided by hermetic bonding or on-hermetic seal. According to a specific embodiment, the hermetic bonding is selected from anodic, eutectic, fusion, covalent, glass frit, and others. Alternatively, the non-hermetic seal is selected from epoxy, glue layer, or other polymer based adhesives. Of course, one of ordinary skill in the art would recognize many variations, modifications, and alternatives.

Figure 4:
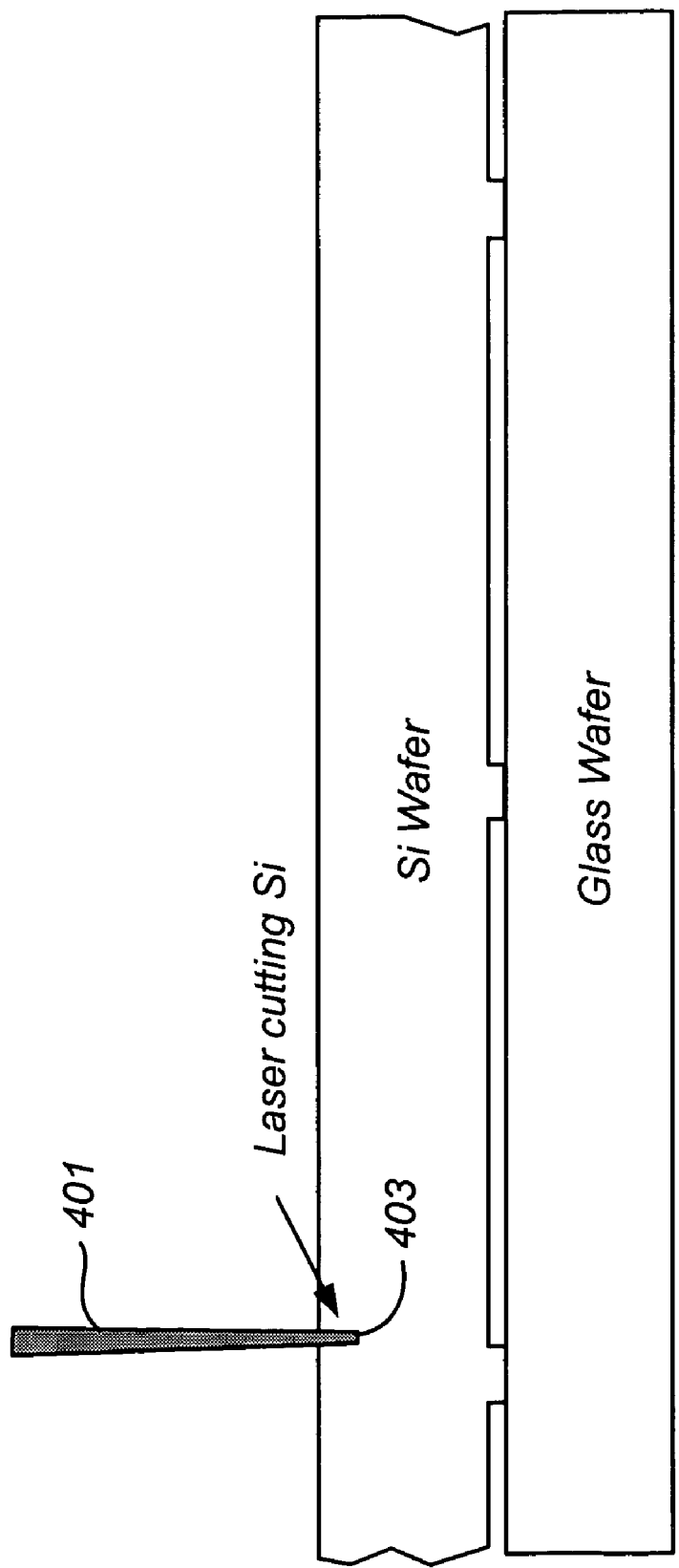
Figure 5:
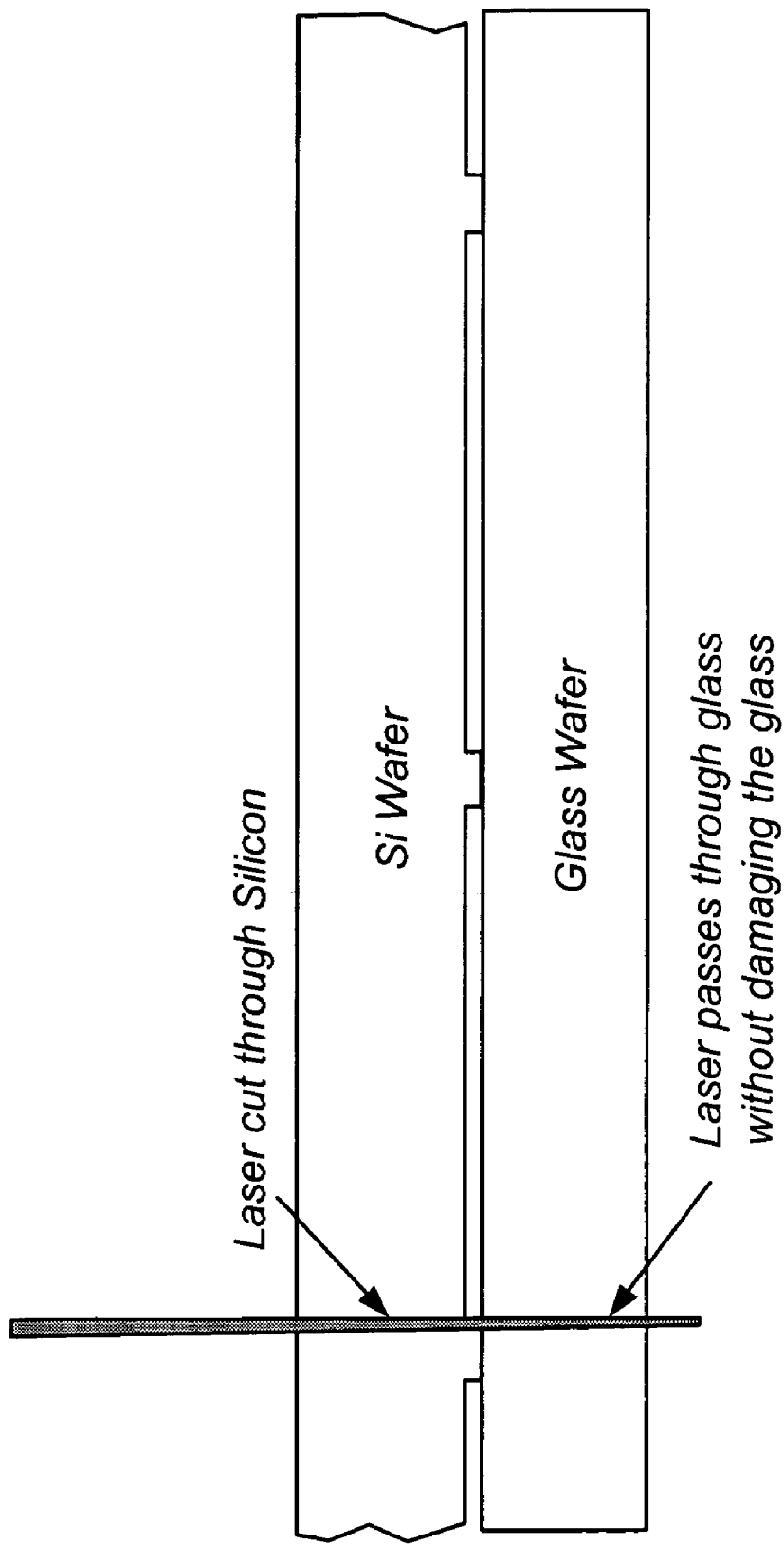

Referring to FIG. 4, the method applies electromagnetic radiation 401 comprising a laser beam to selected regions 403 on the backside to ablate a thickness of silicon substrate overlying each of the recessed regions. Preferably, the electromagnetic radiation ablates through an entirety of the thickness of the silicon substrate overlying each of the recessed regions and traverses through the handle substrate free from any damage from the electromagnetic radiation, as illustrated by FIG. 5. In a specific embodiment, the laser source is ultraviolet (UV) radiation, infrared radiation (IR), or other suitable types. The laser has a beam spot size of about 20 to 100 microns, and others. An example of such a laser can be one manufactured by Spectra-Physics of 1335 Terra Bella Avenue, in Mountain View, Calif. 94039, but can be others.

Optionally, the method includes a process of providing a protective layer overlying regions of the substrate that are not subjected to the laser. The protective layer can be any suitable material including an organic material or an inorganic material. The protective layer keeps any detrimental influences of the laser from damaging portions of the silicon substrate. In a preferred embodiment, the protective layer can be a organic photo mask material, which can be used to protect the surface. Of course, one of ordinary skill in the art would recognize other variations, modifications, and alternatives.

Figure 6:
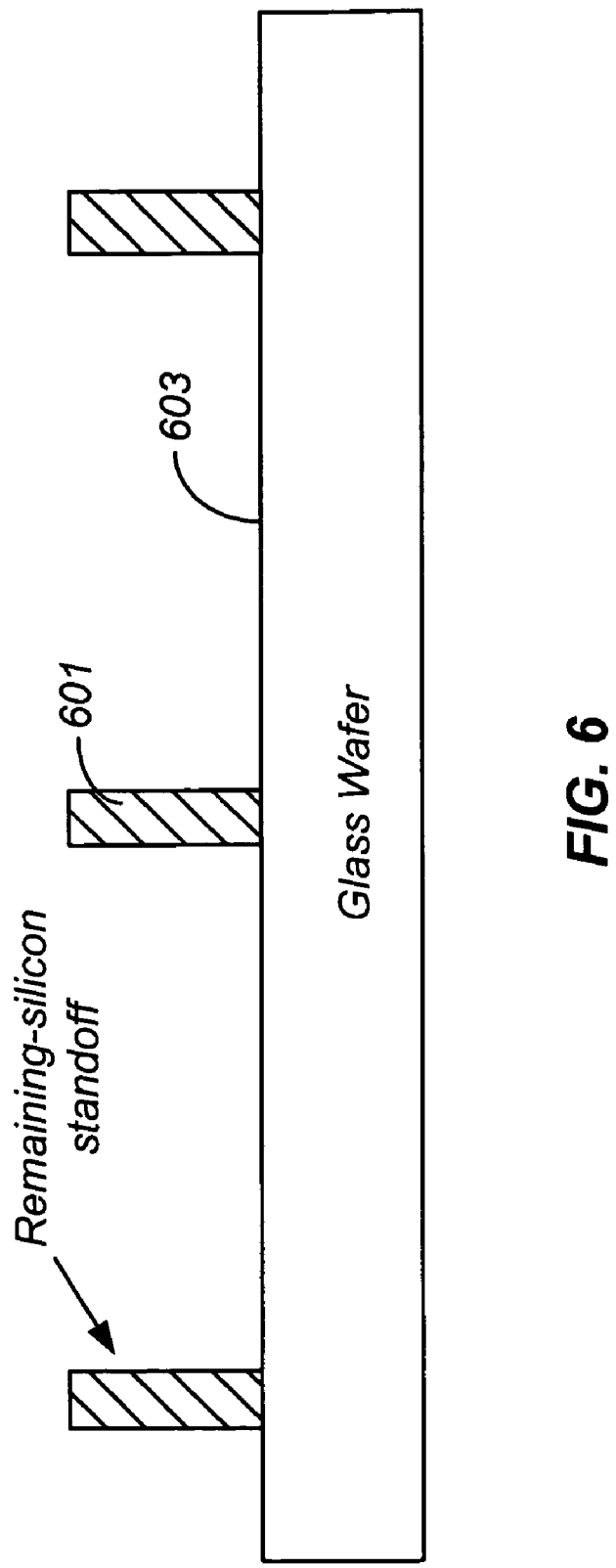
Figure 7:
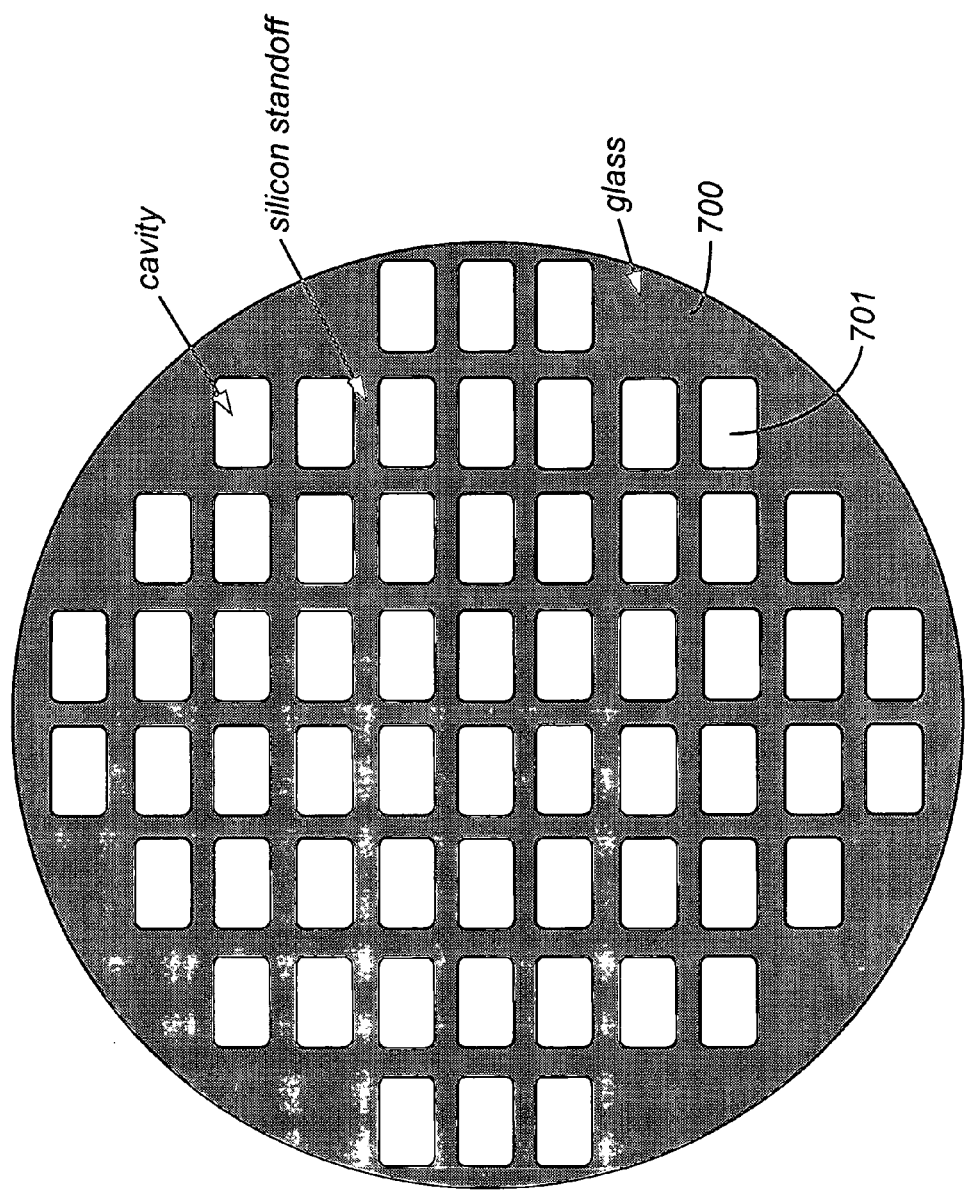

The method includes releasing a thickness of material defined within the recessed region while maintaining each of the border regions bonded to the handle surface region to form a plurality of silicon structures bonded to the handle surface region, as illustrated by a final structure of FIG. 6. As shown, the structure has a plurality of silicon standoffs 601, which are each bonded to handle substrate 603. Referring now to FIG. 7, each of the silicon standoff structures forms a continuous region 711. A plurality of openings 701 are provided in the standoff structures to form a plurality of recessed regions border by the standoff regions and portion of handle substrate. Each of the silicon structures is characterized by a height of ranges from about 650 to about 750 microns according to a specific embodiment. Each of the silicon structures is characterized by a width of 1 millimeters and less according to a specific embodiment.

Figure 8:
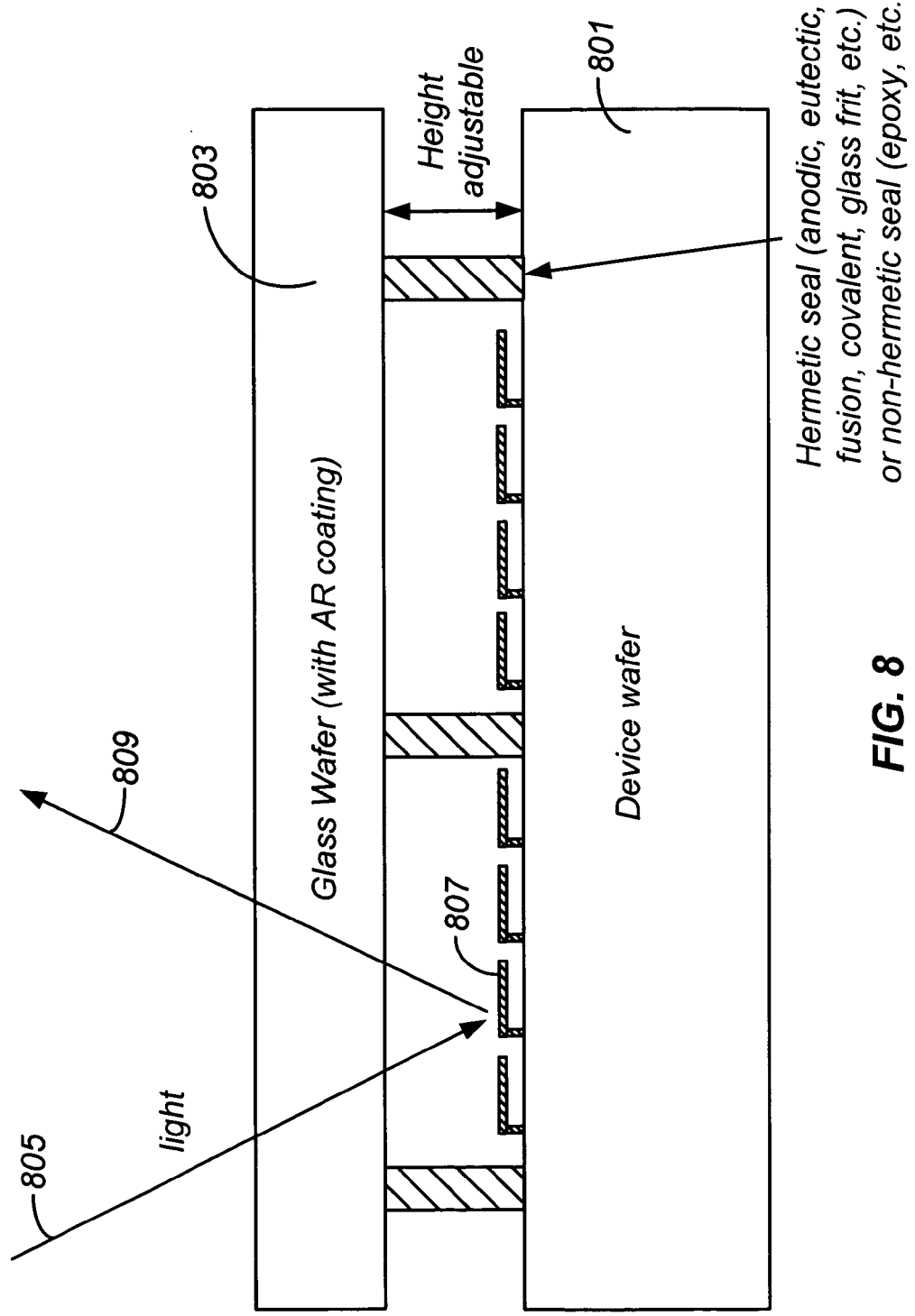
Figure 9:
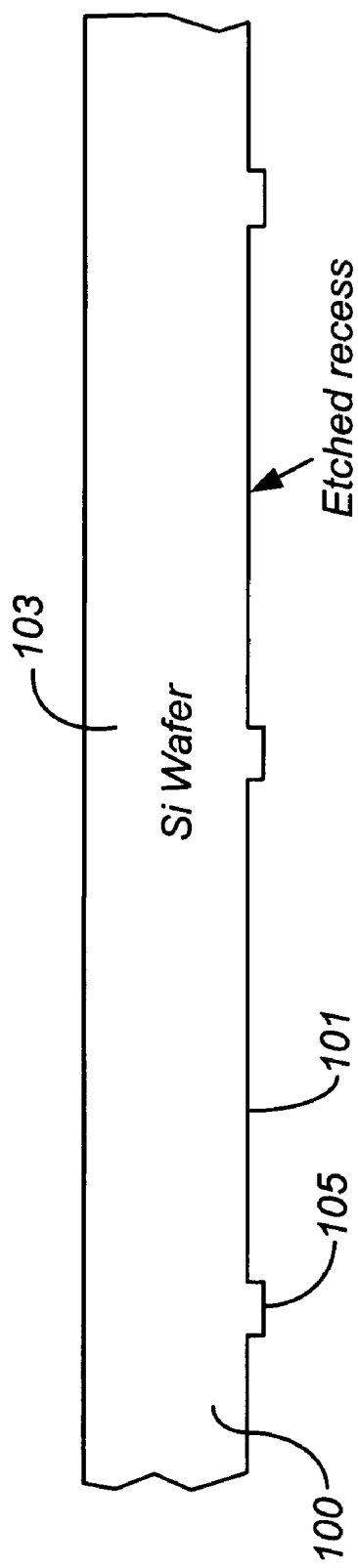
FIGS. 9 through 17 are simplified cross-sectional view diagrams illustrating alternative methods for packaging an optical device according to embodiments of the present invention.

Referring to FIG. 8, the method includes bonding a device substrate 801 on each of the silicon standoff structures on substrate 801. Preferably, the device substrate comprises a plurality of micro-mirror structures or other like structures. Each of the micro-mirror structures IS aligned to each of the regions previously occupied by a recessed region, as also shown. Light 805 traverses through the handle substrate, which has antireflective coatings, reflects off of optical deflection device 807, and traverses back 809 through a portion of the handle substrate. Bonding the standoff structures to the device substrate can be achieved through hermetic sealing techniques. Such techniques include, among others, anodic, eutectic, fusion, covalent, glass frit, etc. Other techniques such as non-hermetic seals can also be used. Such non-hermetic seals use epoxy, glue layers, or the ones noted above, among others. Of course, one of ordinary skill in the art would recognize many other variations, modifications, and alternatives.

A method for packaging optical devices according to an alternative embodiment of the present invention may be outlined as follows:

1. Provide a silicon substrate, which has a surface region and a backside region;
2. Mask substrate to form openings;
3. Form a plurality of recessed regions on the surface region, where each of the plurality of recessed regions has a border region surrounding a periphery of each of the recessed regions while using the patterned mask as a protective layer;
4. Strip mask layer;
5. Plasma activate surfaces of border regions (optional);
6. Bond (e.g., hermetic bonding or on-hermetic seal) the patterned surface region to a handle surface region of a handle substrate, e.g., glass substrate, where each of the border regions, which protrude outwardly from the recessed regions, is bonded to the handle surface region, while each of the recessed regions remain free from attachment to any surface of the handle surface region;
7. Perform bond treatment on bonded multi-layered substrates;
8. Apply electromagnetic radiation comprising a laser beam to selected regions on the backside to ablate a thickness of silicon substrate overlying each of the recessed regions;
9. Release via etching a thickness of material defined within the recessed region while maintaining each of the border regions bonded to the handle surface region to form a plurality of silicon structures bonded to the handle surface region, where each of the silicon structures form a cavity region bordered by a portion of the handle substrate;
10. Plasma activate silicon structures (optional);
11. Bond each of the silicon structures to a device substrate (e.g., optical device, optical and integrated circuit device) to enclose a portion of the device substrate with each of the silicon structures;
12. Perform bond treatment to bonded substrates; and
13. Perform other steps, as desired.

The above sequence of steps provides a method for packaging a optical device according to an embodiment of the present invention. As shown, the method uses a combination of steps including a way of forming a plurality of silicon structures that form standoff regions to be bonded to a device substrate according to an embodiment of the present invention. Other alternatives can also be provided where steps are added, one or more steps are removed, or one or more steps are provided in a different sequence without departing from the scope of the claims herein. Further details of the present method can be found throughout the present specification and more particularly below.

FIGS. 9 through 17 are simplified cross-sectional view diagrams illustrating methods for packaging an optical device according to embodiments of the present invention. These diagrams are merely examples, which should not unduly limit the scope of the claims herein. One of ordinary skill in the art would recognize many variations, alternatives, and modifications. Like reference numerals are used in these diagrams as the prior diagrams but are not intended to be limiting the scope of the invention claimed herein. As shown, the diagrams provide methods for forming a patterned silicon bearing material for packaging optical devices according to an embodiment of the present invention. The method includes providing a silicon substrate 100, e.g., silicon wafer. The silicon substrate has a surface region 107 and a backside region 103. The surface region is often called a face region, although other terms may be used. The method includes forming a plurality of recessed regions 101 on the surface region. Each of the plurality of recessed regions having a border region 105. The plurality of recessed regions forms a patterned surface region. Depending upon the application, masking and etching techniques can be used to form each of the recessed regions. Preferably, each of the recessed regions has a depth of more than about 10 microns although other depths can be used. Plasma and/or reactive ion etching techniques may be used, depending upon the embodiment. Each of the recessed regions corresponds to a region to be occupied by at least one "chip" or "device" depending upon the embodiment.

Figure 10:
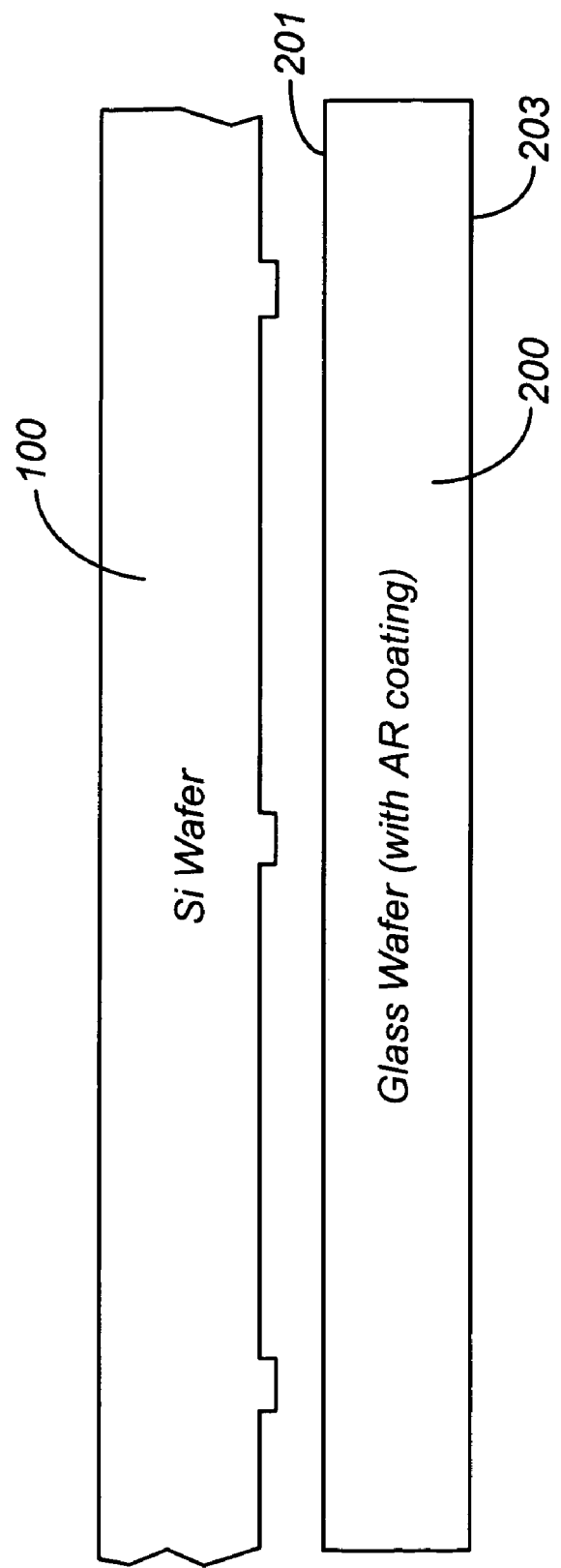

Referring to FIG. 10, the method includes bonding the patterned surface region to a handle surface region of a handle substrate 200. The handle substrate includes surface region 201 and backside region 203. Optionally, each of the substrates can be treated to enhance bonding. Treatment can include plasma activation using an oxygen bearing plasma or other plasma and the like. An antireflective coating may be applied to the backside and surface of the handle substrate. Preferably, the handle substrate is optically transparent, such as those noted above, although there may be others. The antireflective coating can include any suitable materials. Of course, one of ordinary skill in the art would recognize many variations, modifications, and alternatives.

Figure 11:
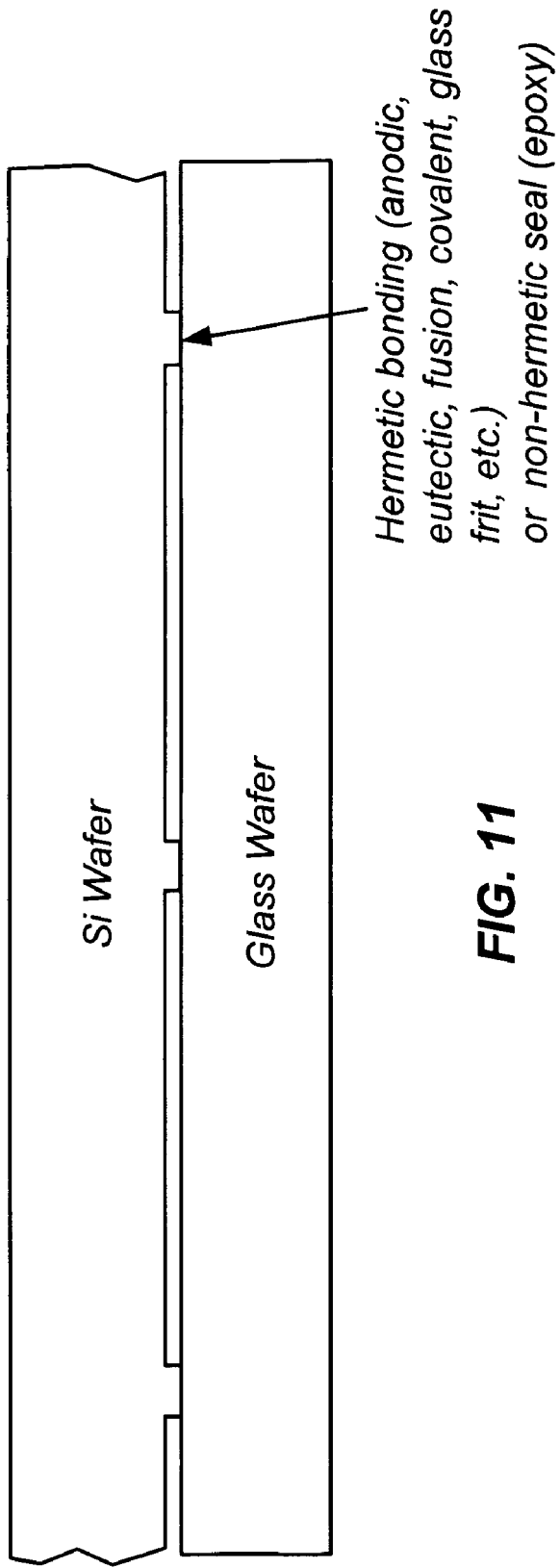

Each of the border regions is bonded to the handle surface region, while each of the recessed regions remain free from attachment to any surface of the handle surface region, as shown in FIG. 11. In a specific embodiment, the bonding is provided by hermetic bonding or on-hermetic seal. According to a specific embodiment, the hermetic bonding is selected from anodic, eutectic, fusion, covalent, glass frit, and others. Alternatively, the non-hermetic seal is selected from epoxy, glue layer, or polymer adhesives, and the like. Of course, one of ordinary skill in the art would recognize many variations, modifications, and alternatives.

Figure 12:
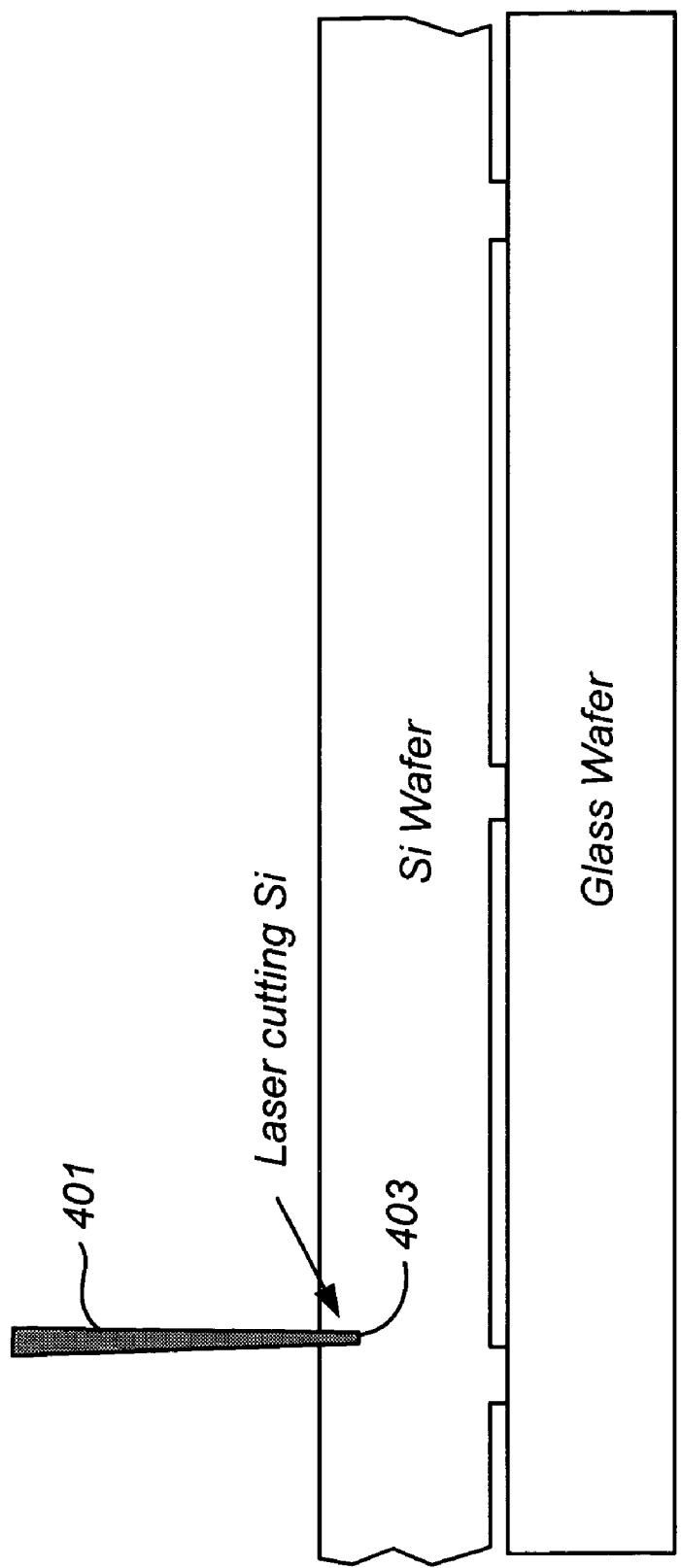

Referring to FIG. 12, the method applies electromagnetic radiation 401 comprising a laser beam to selected regions 403 on the backside to ablate a thickness of silicon substrate overlying each of the recessed regions. Preferably, the electromagnetic radiation ablates through an entirety of the thickness of the silicon substrate overlying each of the recessed regions and traverses through the handle substrate free from any damage from the electromagnetic radiation. In a specific embodiment, the laser source is the one noted above but can be others. As shown, only a portion 403 of the silicon material has been removed while a thickness remains according to a specific embodiment.

Figure 13:
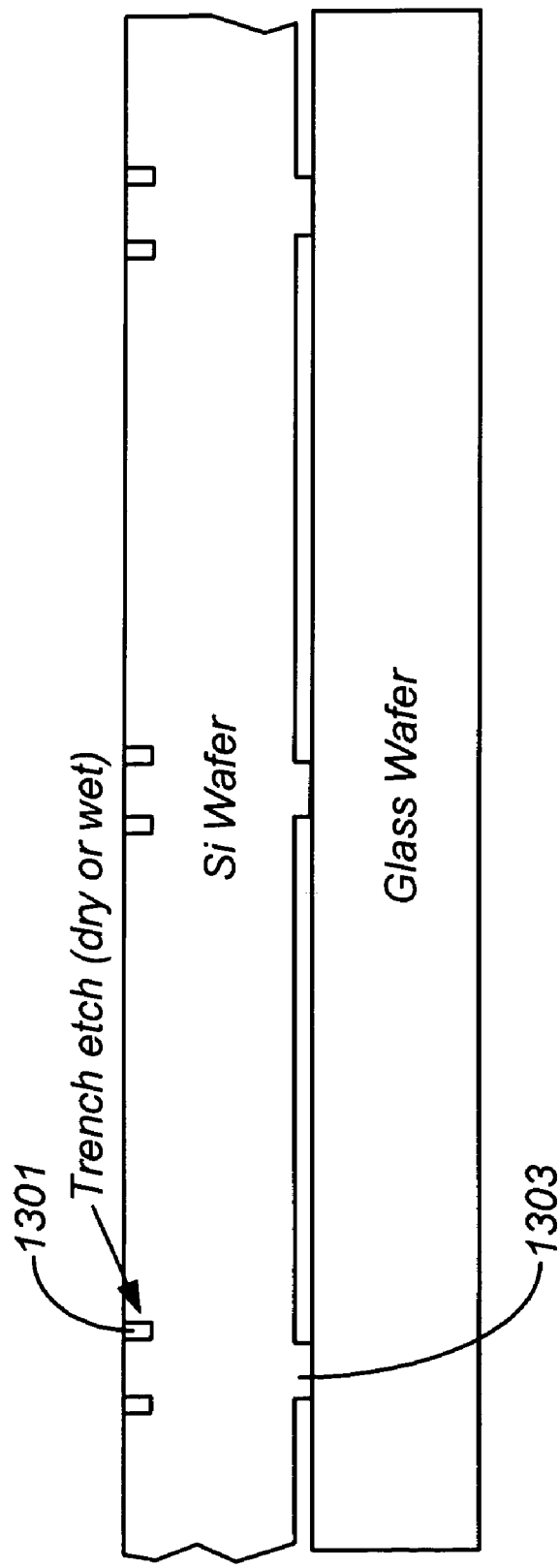
Figure 14:
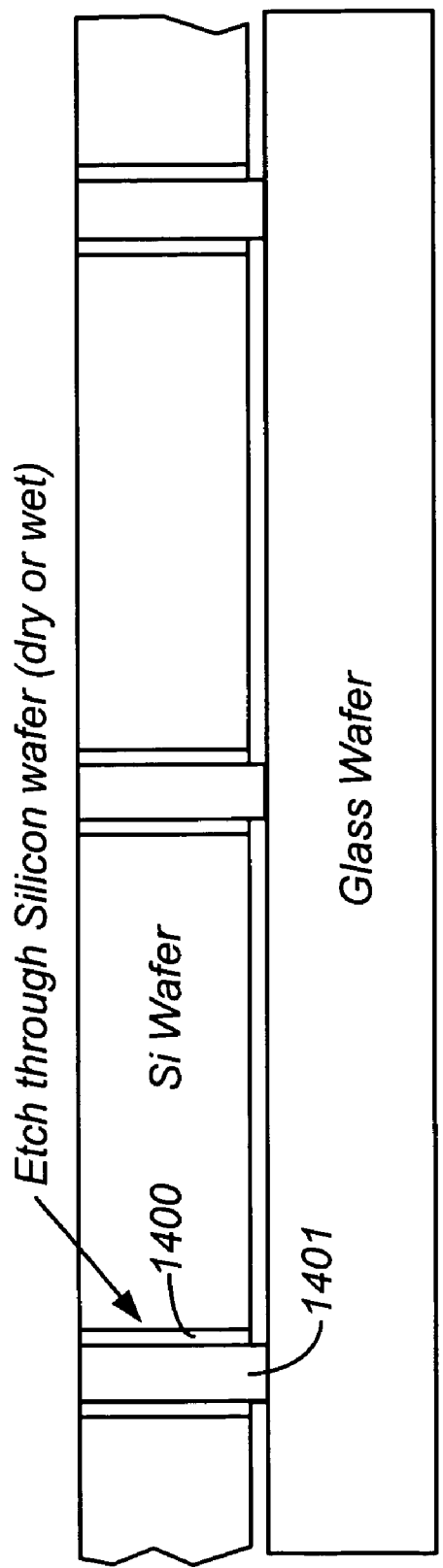

Referring now to FIG. 13, according to an alternative embodiment, the method forms a trench region 1301 using etching techniques. Such etching techniques, include, among others, wet or dry processes. As an example, the etching technique is potassium hydroxide, Tetra-Methyl Ammonium Hydroxide (THAH), but can be others. A pair of trench regions are provided on each side of the standoff region 1303. The method continues the etching technique, which can be wet or dry, to traverse 1400 through an entirety of the thickness, while maintaining the standoff region 1401. Depending upon the embodiment, the initial trench can be formed using a laser ablation technique or chemical wet or dry process. Of course, one of ordinary skill in the art would recognize many variations, alternatives, and modifications.

Figure 15:
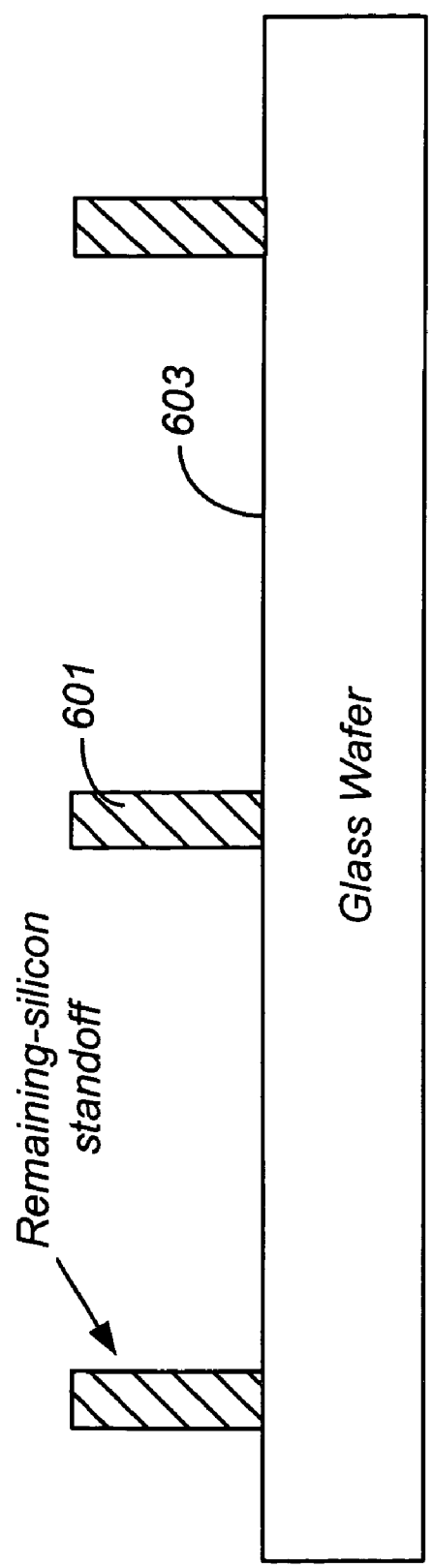
Figure 16:
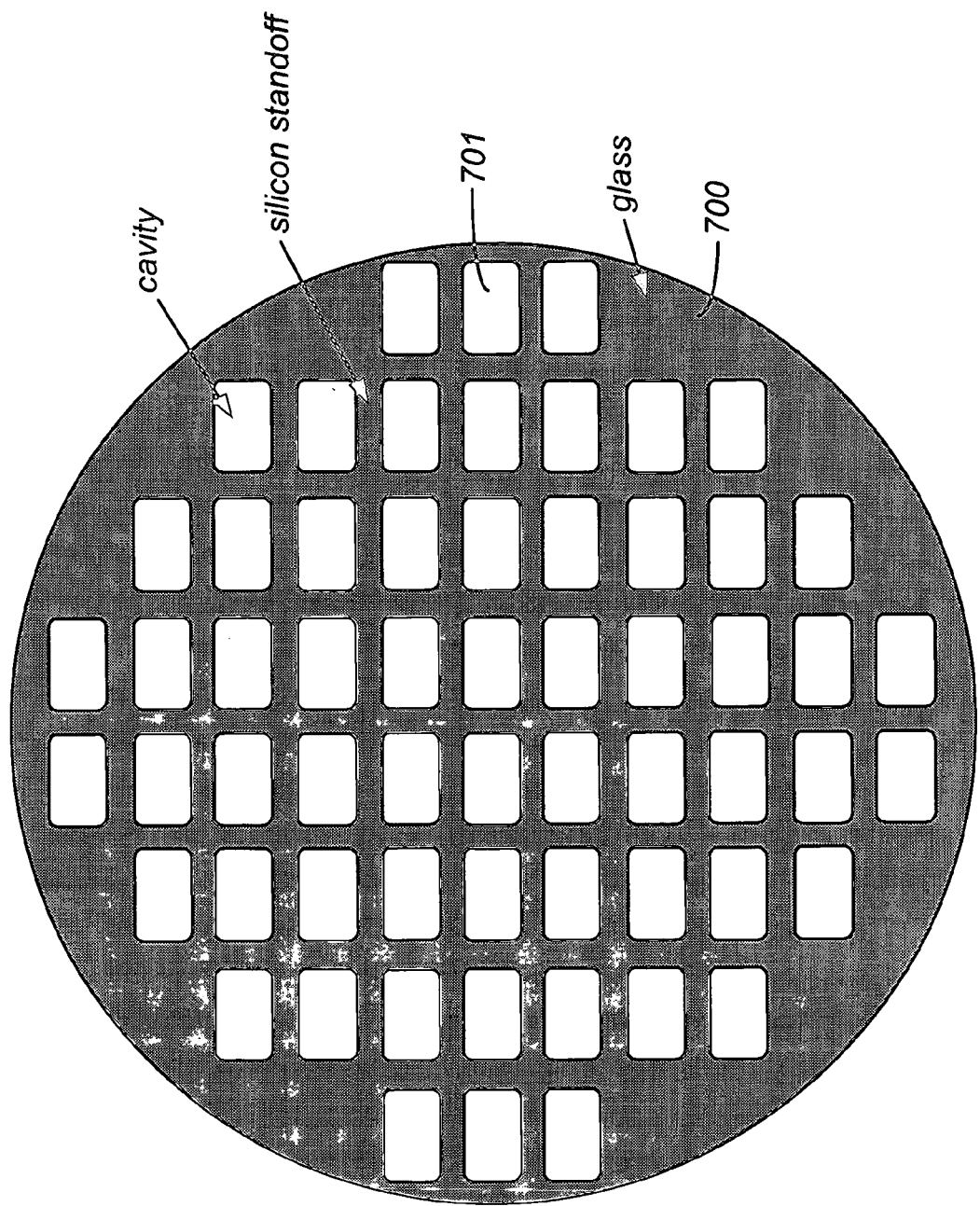

The method includes releasing a thickness of material defined within the recessed region while maintaining each of the border regions bonded to the handle surface region to form a plurality of silicon structures bonded to the handle surface region, as illustrated by a final structure of FIG. 15. As shown, the structure has a plurality of silicon standoffs 601, which are each bonded to handle substrate 603. Referring now to FIG. 16, each of the silicon standoff structures forms a continuous region 711. A plurality of openings 701 are provided in the standoff structures to form a plurality of recessed regions bonded by the standoff regions and portion of handle substrate. Each of the silicon structures is characterized by a height of ranges from about 650 to about 750 microns according to a specific embodiment. Each of the silicon structures is characterized by a width of 1 millimeters and less according to a specific embodiment.

Figure 17:
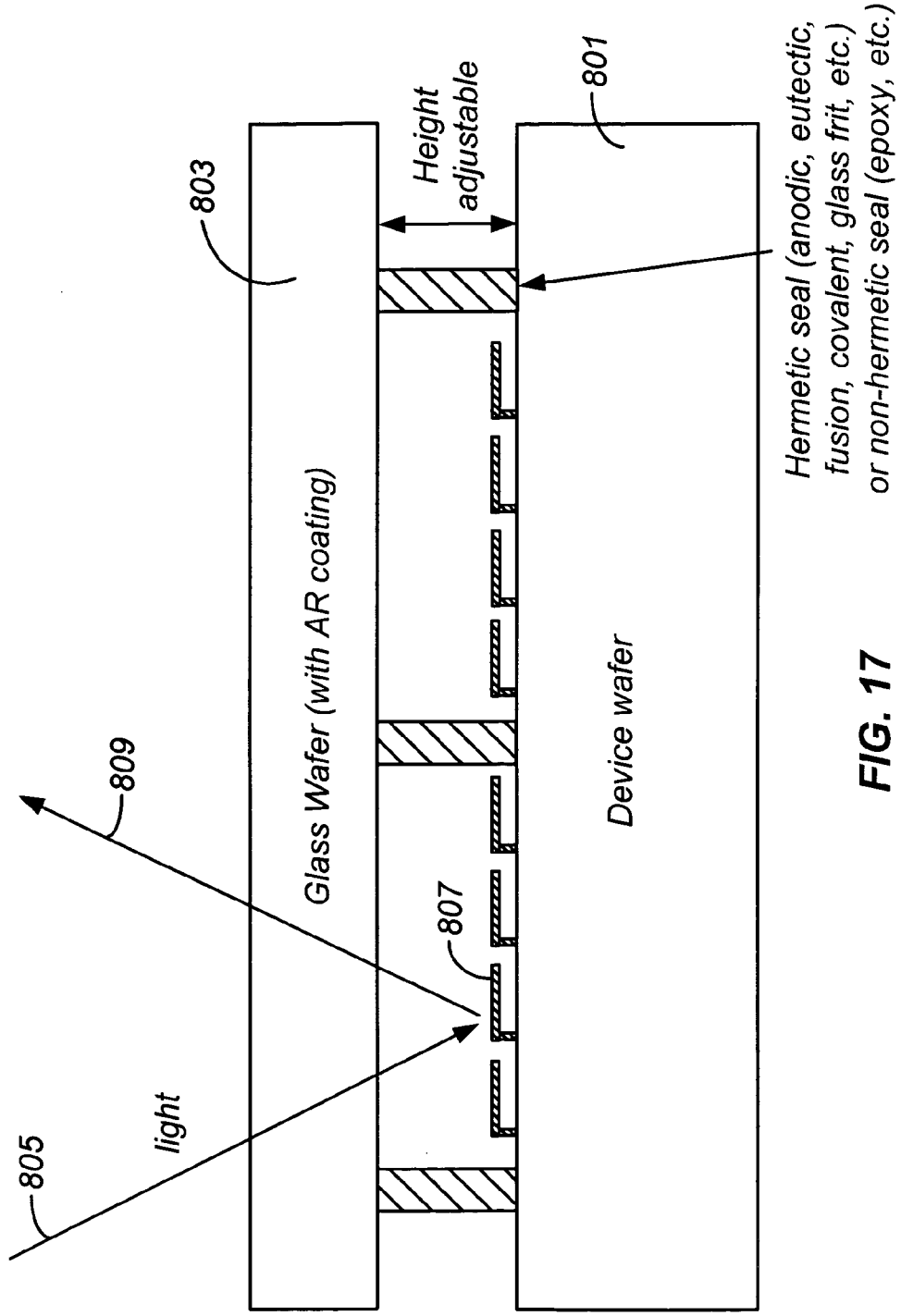

Referring to FIG. 17, the method includes bonding a device substrate 801 on each of the silicon standoff structures on substrate 801. Preferably, the device substrate comprises a plurality of micro-mirror structures or other like structures. Each of the micro-mirror structures IS aligned to each of the regions previously occupied by a recessed region, as also shown. Light 805 traverses through the handle substrate, which has antireflective coatings, reflects off of optical deflection device 807, and traverses back 809 through a portion of the handle substrate. Bonding the standoff structures to the device substrate can be achieved through hermetic sealing techniques. Such techniques include, among others, anodic, eutectic, fusion, covalent, glass frit, etc. Other techniques such as non-hermetic seals can also be used. Such non-hermetic seals use epoxy, glue layers, or polymer adhesives, among others. Of course, one of ordinary skill in the art would recognize many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a patterned silicon bearing material, the method comprising:
    providing a silicon substrate, the silicon substrate having a surface region and a backside region;
    forming a plurality of recessed regions on the surface region, each of the plurality of recessed regions having a border region, the plurality of recessed regions forming a patterned surface region;
    bonding the patterned surface region to a handle surface region of a handle substrate, each of the border regions being bonded to the handle surface region, while each of the recessed regions remain free from attachment to any surface of the handle surface region;
    applying electromagnetic radiation comprising a laser beam to selected regions on the backside to ablate a thickness of silicon substrate overlying each of the recessed regions; and
    releasing a thickness of material defined within the recessed region while maintaining each of the border regions bonded to the handle surface region to form a plurality of silicon structures bonded to the handle surface region.

2. The method of claim 1 wherein the handle substrate comprises a glass substrate.

3. The method of claim 1 wherein the handle substrate is optically transparent.

4. The method of claim 1 wherein the bonding is provided by hermetic bonding or on-hermetic seal.

5. The method of claim 4 wherein the hermetic bonding is selected from anodic, eutectic, fusion, covalent, glass frit, and others.

6. The method of claim 4 wherein the non-hermetic seal is selected from epoxy, glue layer, and polymer adhesives.

7. The method of claim 1 wherein the electromagnetic radiation ablates through an entirety of the thickness of the silicon substrate overlying each of the recessed regions and traverses through the handle substrate free from any damage from the electromagnetic radiation.

8. The method of claim 1 further comprising etching the selected regions to release the thickness of material defined within the recessed regions.

9. The method of claim 1 wherein the plurality of silicon structures are a plurality of standoff structures, each of the standoff structures being connected to each other in a continuous manner.

10. The method of claim 1 wherein each of the silicon structures is characterized by a height of ranges from about 650 to about 750 microns.

11. The method of claim 1 wherein each of the silicon structures is characterized by a width of 1 millimeters and less.

12. The method of claim 1 further comprising bonding a device substrate on each of the silicon structures.

13. The method of claim 12 wherein the device substrate comprises a plurality of micro-mirror structures, each of the micro-mirror structures being aligned to each of the regions previously occupied by a recessed region.

14. The method of claim 1 wherein the thickness is a portion of an entirety of a thickness of the silicon substrate.

15. The method of claim 1 wherein the handle substrate comprises an overlying anti-reflective layer.

16. A method for forming a patterned silicon bearing material, the method comprising:
    providing a silicon substrate, the silicon substrate having a surface region and a backside region;
    forming a plurality of recessed regions on the surface region, each of the plurality of recessed regions having a border region, the plurality of recessed regions forming a patterned surface region;
    bonding the patterned surface region to a handle surface region of a handle substrate, each of the border regions being bonded to the handle surface region, while each of the recessed regions remain free from attachment to any surface of the handle surface region;
    applying electromagnetic radiation comprising a laser beam to selected regions on the backside to ablate a portion of a thickness of silicon substrate overlying each of the recessed regions; and
    etching the selected regions to release an entirety of a thickness of material defined within the recessed region while maintaining each of the border regions bonded to the handle surface region to form a plurality of silicon structures bonded to the handle surface region.

17. The method of claim 16 wherein the handle substrate comprises a glass substrate.

18. The method of claim 16 wherein the handle substrate is optically transparent.

19. The method of claim 16 wherein the bonding is provided by hermetic bonding or on-hermetic seal.

20. The method of claim 16 wherein the hermetic bonding is selected from anodic, eutectic, fusion, covalent, glass frit, and others.

21. The method of claim 16 wherein the non-hermetic seal is selected from epoxy, glue layer, or polymer adhesive.

22. The method of claim 19 wherein the laser beam is from a UV or IR source.

23. The method of claim 16 wherein the plurality of silicon structures are a plurality of standoff structures, each of the standoff structures being connected to each other in a continuous manner.

24. The method of claim 16 wherein each of the silicon structures is characterized by a height of ranges from about 650 to about 750 microns.

25. The method of claim 16 wherein each of the silicon structures is characterized by a width of 1 millimeters and less.

26. The method of claim 16 further comprising bonding a device substrate on each of the silicon structures.

27. The method of claim 26 wherein the device substrate comprises a plurality of micro-mirror structures, each of the micro-mirror structures being aligned to each of the regions previously occupied by a recessed region.

28. The method of claim 16 wherein the handle substrate comprises an overlying anti-reflective layer.

* * * * *